United States Patent
Paniconi

(10) Patent No.: US 8,661,323 B2
(45) Date of Patent: Feb. 25, 2014

(54) METHOD AND APPARATUS FOR GENERATING PACKET MASK

(75) Inventor: Marco Paniconi, Campbell, CA (US)

(73) Assignee: Google Inc., Mountain View, CA (US)

(*) Notice: Subject to any disclaimer, the term of this patent is extended or adjusted under 35 U.S.C. 154(b) by 249 days.

(21) Appl. No.: 13/103,565

(22) Filed: May 9, 2011

(65) Prior Publication Data
US 2012/0290900 A1    Nov. 15, 2012

(51) Int. Cl.
*H03M 13/00* (2006.01)
*G06F 11/00* (2006.01)

(52) U.S. Cl.
USPC .......................... 714/776; 714/704

(58) Field of Classification Search
USPC .......................... 714/776, 704, 746
See application file for complete search history.

(56) References Cited

U.S. PATENT DOCUMENTS

| | | | |
|---|---|---|---|
| 6,266,337 B1 | 7/2001 | Marco | |
| 6,587,985 B1 | 7/2003 | Fukushima et al. | |
| 6,684,354 B2 | 1/2004 | Fukushima et al. | |
| 6,732,313 B2 | 5/2004 | Fukushima et al. | |
| 6,741,569 B1 * | 5/2004 | Clark | 370/252 |
| 6,918,077 B2 | 7/2005 | Fukushima et al. | |
| 7,124,333 B2 | 10/2006 | Fukushima et al. | |
| 7,180,896 B1 | 2/2007 | Okumura | |
| 7,263,644 B2 | 8/2007 | Park et al. | |
| 7,356,750 B2 | 4/2008 | Fukushima et al. | |
| 7,372,834 B2 | 5/2008 | Kim et al. | |
| 7,376,880 B2 | 5/2008 | Ichiki et al. | |
| 7,447,235 B2 | 11/2008 | Luby et al. | |
| 7,447,969 B2 | 11/2008 | Park et al. | |
| 7,484,157 B2 | 1/2009 | Park et al. | |
| 7,636,298 B2 | 12/2009 | Miura et al. | |
| 7,680,076 B2 | 3/2010 | Michel et al. | |
| 7,710,973 B2 * | 5/2010 | Rumbaugh et al. | 370/394 |
| 7,756,127 B2 | 7/2010 | Nagai et al. | |
| 7,823,039 B2 | 10/2010 | Park et al. | |
| 7,974,243 B2 | 7/2011 | Nagata et al. | |
| 8,085,767 B2 * | 12/2011 | Lussier et al. | 370/389 |
| 2002/0157058 A1 | 10/2002 | Ariel et al. | |
| 2003/0098992 A1 | 5/2003 | Park et al. | |
| 2003/0226094 A1 | 12/2003 | Fukushima et al. | |
| 2004/0165585 A1 | 8/2004 | Imura et al. | |

(Continued)

OTHER PUBLICATIONS

Liang, Y.J.; Apostolopoulos, J.G.; Girod, B., "Analysis of packet loss for compressed video: does burst-length matter?," Acoustics, Speech, and Signal Processing, 2003. Proceedings. (ICASSP '03). 2003 IEEE International Conference on , vol. 5, No., pp. V,684-7 vol. 5, Apr. 6-10, 2003.*

(Continued)

*Primary Examiner* — Cynthia Britt
(74) *Attorney, Agent, or Firm* — Young Basile Hanlon & MacFarlane P.C.

(57) ABSTRACT

A method and apparatus generate a forward error correcting code for use with a plurality of source packets to be transmitted over a network. In one exemplary embodiment, the method comprises identifying a plurality of candidate packet masks and selecting that one of the masks that has the lowest expected residual packet loss value ("RPL"). RPL is calculated using an effective recovery rate, which in turn is a function of at least one network performance parameter (such as packet loss) and one or more channel code parameters such as the number of source packets and/or FEC packets. The error correcting code can be generated using the selected packet mask and at least one of the source packets.

23 Claims, 5 Drawing Sheets

(56) References Cited

U.S. PATENT DOCUMENTS

| | | | |
|---|---|---|---|
| 2005/0154965 | A1 | 7/2005 | Ichiki et al. |
| 2005/0180415 | A1 | 8/2005 | Cheung et al. |
| 2006/0150055 | A1 | 7/2006 | Quinard et al. |
| 2007/0168824 | A1 | 7/2007 | Fukushima et al. |
| 2008/0101403 | A1 | 5/2008 | Michel et al. |
| 2008/0109707 | A1* | 5/2008 | Dell et al. .................. 714/776 |
| 2008/0209300 | A1 | 8/2008 | Fukushima et al. |
| 2009/0022157 | A1* | 1/2009 | Rumbaugh et al. ........... 370/394 |
| 2009/0059917 | A1* | 3/2009 | Lussier et al. ................ 370/389 |
| 2009/0138784 | A1 | 5/2009 | Tamura et al. |
| 2009/0249158 | A1 | 10/2009 | Noh et al. |
| 2010/0122127 | A1* | 5/2010 | Oliva et al. .................. 714/704 |
| 2010/0153828 | A1* | 6/2010 | De Lind Van Wijngaarden et al. ............................. 714/807 |
| 2010/0202414 | A1* | 8/2010 | Malladi et al. ................ 370/335 |
| 2010/0306618 | A1* | 12/2010 | Kim et al. .................... 714/755 |

OTHER PUBLICATIONS

Yoo, S. J. B., "Optical Packet and Burst Switching Technologies for the Future Photonic Internet," Lightwave Technology, Journal of , vol. 24, No. 12, pp. 4468,4492, Dec. 2006.*

Friedman, et al., "RTP: Control Protocol Extended Reports (RTPC XR)," Network Working Group RFC 3611 (The Internet Society 2003) (52 pp).

U.S. Appl. No. 13/103,565, filed May 9, 2011 titled "Method and Apparatus for Generating Packet Mask", Inventor: Paniconi.

U.S. Appl. No. 13/305,021, filed Nov. 28, 2011 titled "Method and Apparatus for Requesting Retransmission of Missing Packets in Data Communications", Inventors: Shemer et al.

U.S. Appl. No. 13/305,175, filed Nov. 28, 2011 titled "Method and Apparatus for Decoding Packetized Data", Inventors: Paniconi et al.

U.S. Appl. No. 13/421,031, filed Mar. 15, 2012 titled "Adaptive Protection Modes for Packet Loss in Digital Video Streams", Inventors: Paniconi et al.

Roca, Vincent, et al., Design and Evaluation of a Low Density Generator Matrix (LDGM) Large Block FEC Codec, INRIA Rhone-Alpes, Planete project, France, Date Unknown, (12 pp).

Li, A., "RTP Payload Format for Generic Forward Error Correction", Network Working Group, Standards Track, Dec. 2007, (45 pp).

Wikipedia, the free encyclopedia, "Low-density parity-check code", http://en.wikipedia.org/wiki/Low-density_parity-check_code, Jul. 30, 2012 (5 pp).

Korhonen, Jari; Frossard, Pascal; "Flexible forward error correction codes with application to partial media data recovery", Signal Processing: Image Communication vol. 24, No. 3 (Mar. 2009) pp. 229-242.

Frossard, Pascal; "Joint Source/FEC Rate Selection for Quality-Optimal MPEG-2 Video Delivery", IEEE Transactions on Image Processing, vol. 10, No. 12, (Dec. 2001) pp. 1815-1825.

Yu, Xunqi, et al; "The Accuracy of Markov Chain Models in Predicting Packet-Loss Statistics for a Single Multiplexer", IEEE Transaactions on Information Theory, vol. 54, No. 1 (Jan. 2008) pp. 489-501.

International Search Report and Written Opinion for International Application No. PCT/US2011/051818 dated Nov. 21, 2011 (16 pages).

\* cited by examiner

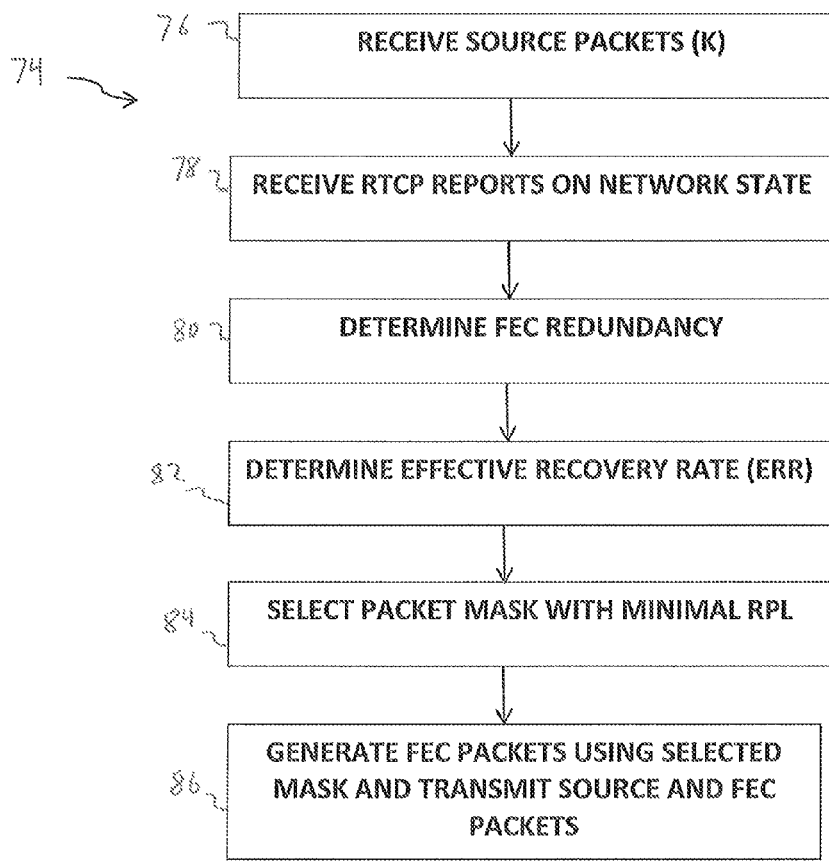

| Index | ERR |
|---|---|
| 1029039 | 0.20393 |
| 1045548 | 0.30949 |
| 1084782 | 0.40939 |
|  |  |
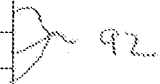
FIG. 7
| Index | Packet Mask |
|---|---|
| 340932 | 0 1 0 0 1 0<br>0 1 1 0 0 0 |
| 387654 | 1 1 0 0 0 0<br>0 1 0 0 1 0 |
| 484543 | 0 0 0 1 1 0<br>0 0 1 0 0 1 |
|  |  |
FIG. 8

METHOD AND APPARATUS FOR GENERATING PACKET MASK

TECHNICAL FIELD

The present invention relates to the field of data communications generally and in particular to techniques for error correction.

BACKGROUND

Many kinds of data are transmitted over the Internet and other networks, including video and audio data. Data can for example be transmitted from one computer or other transmitting station to another remote computer or other receiving station. Data transmission over networks such as the Internet is frequently accomplished by packetizing the message to be transmitted—that is, by dividing the message into packets which are reassembled at the receiving end to reconstruct the original message. Packets may be lost or delayed during transmission, resulting in corruption of the message. This can be especially problematic when it occurs during real time transmission of data (such as a-during a voice over IP (VOIP) session or video conferencing).

To address the problem of packet loss and other errors, schemes have been proposed for providing additional information in transmissions of data. This additional information can be used by the receiving station to detect and/or correct errors. One such scheme is forward error-correction coding, also called channel coding (hereinafter "FEC" coding). See, e.g., Lee, A. "RTP Payload Format for Generic Forward Error Correction," RFC 5109, December, 2007. Under this approach, an FEC packet is applied as an XOR channel code. The XOR code is used to generate the FEC packets by means of a packet mask. RFC 5109 does not specify the specific design of the packet mask. In some implementations, packet masks are defined heuristically, which can lead to reduced packet loss recovery.

SUMMARY

An apparatus and method is disclosed for generating a packet mask. In accordance with one aspect of the disclosed embodiments, a method is provided for generating an error correcting code for use with a plurality of source packets to be transmitted over a network. The method includes identifying a plurality of candidate packet masks; determining one or more channel code parameters; determining, for at least some of the plurality of candidate packet masks, a residual packet loss value that is calculated over a range of at least one network performance parameter using the one or more channel code parameters; selecting at least one of the plurality of candidate packet masks based on at least one of the determined residual packet loss values; and generating the error correcting code using the selected candidate packet mask and at least one of the plurality of source packets.

In accordance with another aspect of the disclosed embodiments, a method is provided for transmitting packetized data over a communications network. The method includes identifying a plurality of candidate packet masks; identifying an importance value of the packetized data; determining one or more channel code parameters; and determining, for at least some of the plurality of candidate packet masks, a residual packet loss value that is calculated over a range of at least one network performance parameter using the one or more channel code parameters. The residual packet loss value is a function at least in part of the importance value identified for the packetized data that would be recovered using that packet mask. The method further comprises selecting at least one of the plurality of candidate packet masks based on at least one of the determined residual packet loss values; and generating the error correcting code using the selected candidate packet mask and the packetized data. The packetized data and error correcting code are transmitted over the communications network.

In accordance with another aspect of the disclosed embodiments, an apparatus is provided for generating an error correcting code for use with a plurality of source packets to be transmitted over a network. The apparatus includes a memory and a processor configured to execute instructions stored in the memory. The processor as so configured can determine at least one channel code parameter associated with the error correcting code; determine, for each of a plurality of candidate packet masks, a residual packet loss value that is calculated using the at least one channel code parameter and at least one network performance parameter; select at least one of the plurality of candidate packet masks based on at least one of the determined residual packet loss values; and generate the error correcting code using the selected candidate packet mask and at the at least one source packet.

BRIEF DESCRIPTION OF THE DRAWINGS

The description herein makes reference to the accompanying drawings wherein like reference numerals refer to like parts throughout the several views, and wherein:

FIG. 5 is a schematic diagram of a packet mask;

FIG. 6 is a logic flow chart of the operations of the transmitting station of FIG. 1;

FIG. 7 is a schematic diagram of a look-up table in the memory of the transmitting station that contains pre-calculated mask information; and FIG. 8 is a schematic diagram of a look-up table in the memory of the transmitting station that contains pre-calculated mask information.

DETAILED DESCRIPTION

Disclosed are methods and apparatuses for designing a packet mask to improve the recovery of lost packets. In general terms, design of a packet mask is accomplished by selecting a mask from a given set of input masks {M} which has the minimum residual packet loss over all possible masks in set {M}. Residual packet loss is obtained by subtracting an effective recovery rate ERR from an actual or expected packet loss rate (p). Computation of ERR can take into account one or more factors such as number of source packets, amount of redundancy, the degree of packet loss in the network, and the type of packet loss (random or bursty, for example).

Figure 1:
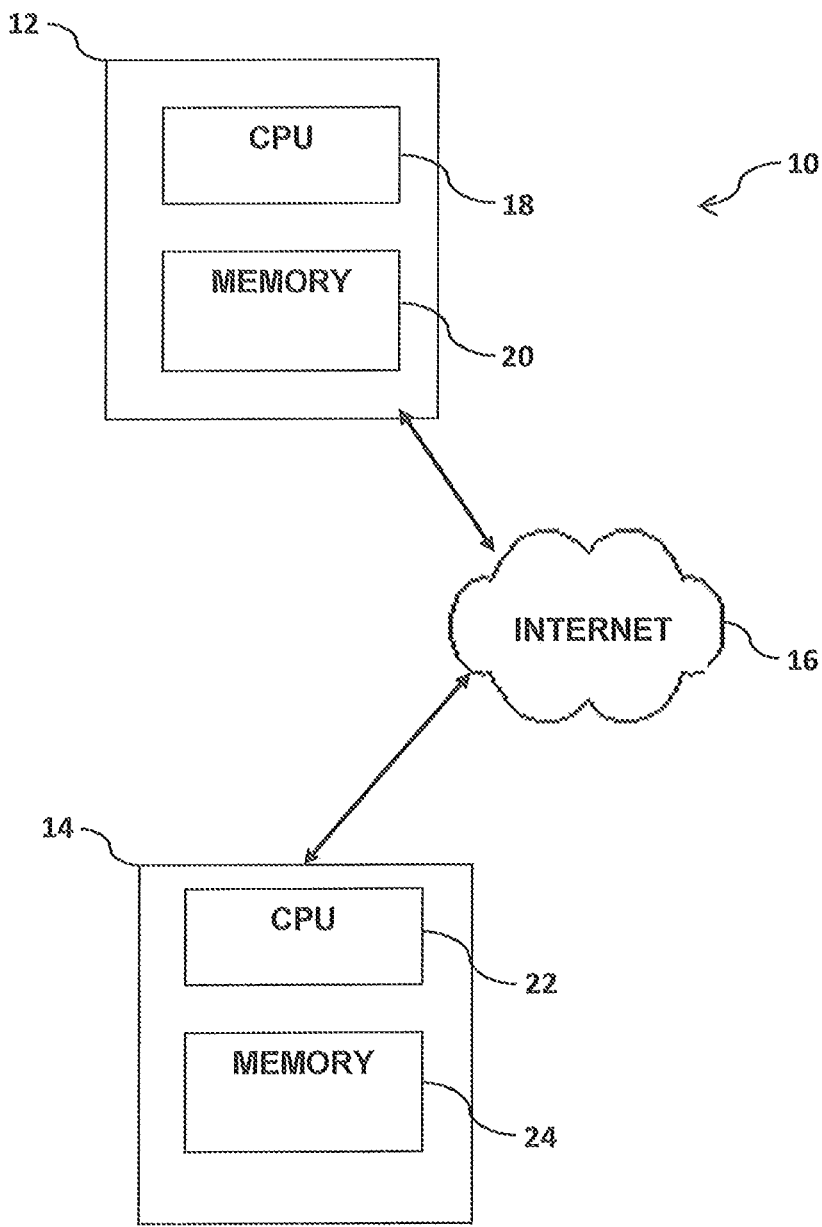
FIG. 1 is a block diagram of a communications system including a transmitting station and a receiving station.

FIG. 1 is a block diagram of a communications system 10 including a transmitting station 12 and a receiving station 14. Transmitting station 12 and receiving station 14 communicate over a communications network 16, which is in this case the Internet; however, other wired and/or wireless communication networks can be used such as local area networks and wide area networks. In this illustration, transmitting station 12 includes a processor 18 and a memory 20. Receiving station 14 includes a processor 22 and memory 24.

Processors 18 and 22 can be computers, servers, or any other computing device or system capable of manipulating or processing information now-existing or hereafter developed, including optical processors, quantum processors and/or molecular processors, general purpose processors, special purpose processors, IP cores, ASICS, programmable logic arrays, programmable logic controllers, microcode, firmware, microcontrollers, microprocessors, digital signal processors, memory, or any combination of the foregoing. In the claims, the term "processor" should be understood as including any the foregoing, either singly or in combination.

Memory 20 and 24 are random access memory (RAM) although any other suitable type of storage device can be used. Generally, processors 18, 22 receive program instructions and data from memory 20, 24, which can be used by the processor for performing the methods described below.

Although FIG. 1 depicts that processors 18, 22 and memory 20,24 are integrated into single units, this depiction is exemplary only. The operations of transmitting station 12 and receiving station 14 can be distributed across multiple processors on the same machine or different machines or across a network such as a local area network, wide area network or the Internet.

In this example, transmitting station 12 and receiving station 14 are used to communicate in real time to permit parties at each station to engage in a videoconference over the Internet. The designation of a station 12 or 14 as "receiving" or "transmitting" is arbitrary and for purposes of illustration. With two-way real time communication, one station 12, 14 will be the transmitting station with respect to a particular message, and the other station 12, 14 will be the receiving station; but these roles can be reversed depending on which station is transmitting a particular message.

Transmitting station 12 and receiving station 14 can be implemented in a wide variety of configurations, including for example on servers in a video conference system. Alternatively, transmitting station 12 can be implemented on a server and receiving station 14 can be implemented on a mobile device such as a mobile telephone or other hand-held communications or computing device. Alternatively, both transmitting station 12 and receiving station 14 can be hand-held devices. Alternatively, receiving station 14 can be a stationary personal computer rather than a mobile device.

Figure 2:
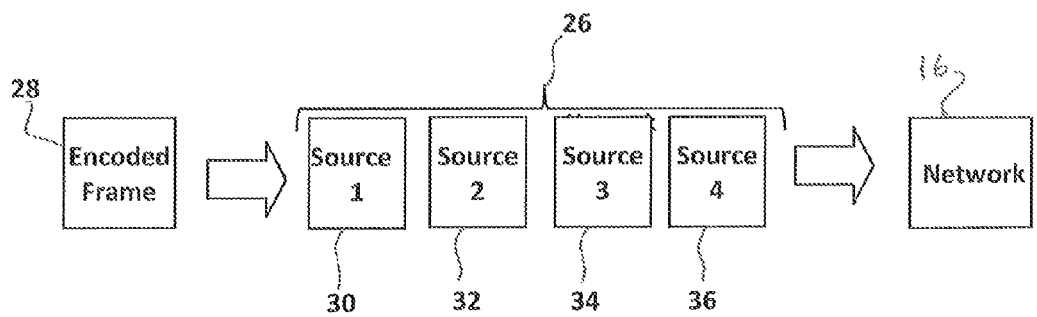
FIG. 2 is a schematic diagram of packetized video data transmitted over the communications system of FIG. 1.

FIG. 2 is a schematic diagram of packetized video data 26 transmitted over the communications network 16 of FIG. 1. Packetized video data 26 is derived from an encoded frame 28 of video data. For purposes of illustration, packetized video data 26 is illustrated as including four source packets 30, 32, 34 and 36 (also referred to herein as Source 1, Source 2, Source 3 and Source 4 respectively). Source packets 30-36 contain the data comprising all or a portion of encoded frame 28. The process of packetization can take place at transmitting station 12. After the video data is packetized, source packets 30-36 are transmitted over communications network 16.

Figure 3:
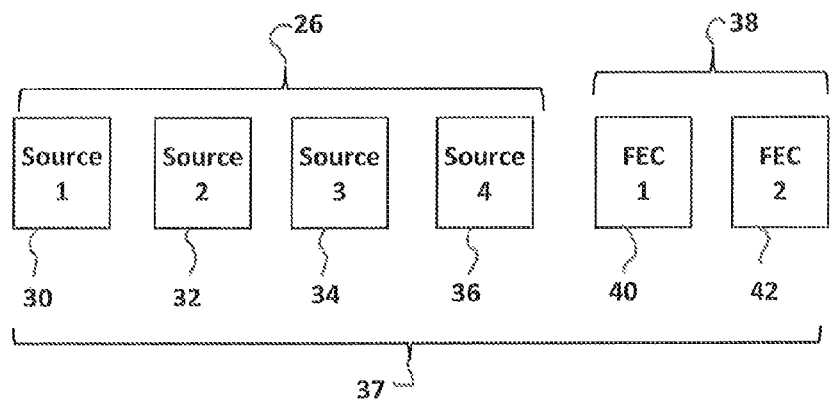
FIG. 3 is a schematic diagram of packetized video data, including FEC packets, transmitted over the communications system of FIG. 1.

FIG. 3 is a schematic diagram of packetized video data 37, including source packets 28 and error correction packets 38, transmitted over the communications network 16 of FIG. 1. Packetized video data 26 is derived from encoded frame 28 of video data as shown in FIG. 2. Error correction packets 38 are derived using a packet mask as described below. Error correction packets 38 comprise two FEC packets, namely an FEC packet 40 and an FEC packet 42. FEC packets 40 and 42 are sometimes referred to herein as FEC 1 and FEC 2, respectively. FEC packets 40 and 42 contain information used by the receiving station 14 to correct packet loss and other errors that may occur when packetized video data 37 is transmitted over a communications network 16. Typically, packets are the same size. If the packets are different sizes, the shorter packet can be padded with zeros.

Figure 4:
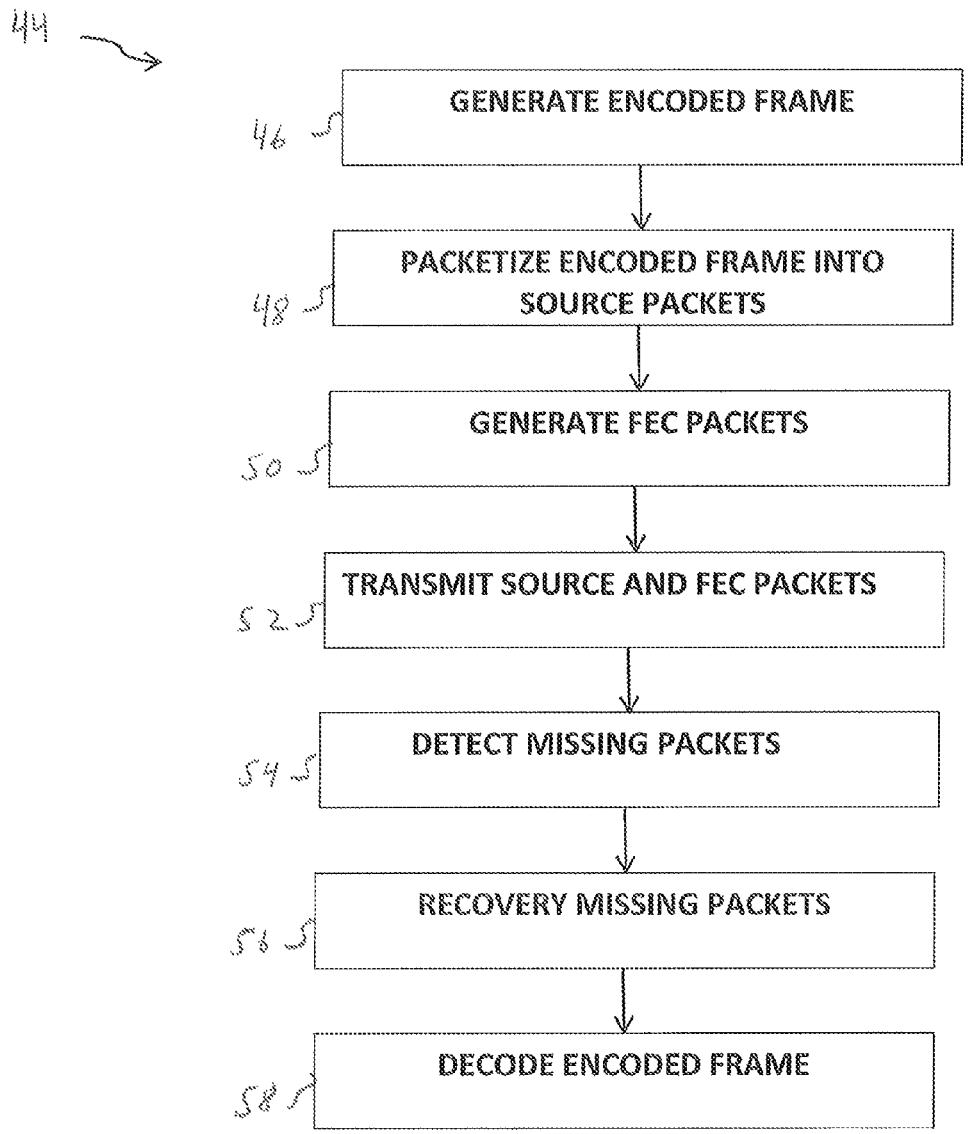
FIG. 4 is a logic flow chart of a method for transmitting and receiving packetized information over a network.

FIG. 4 is a logic flow chart of a method 44 for transmitting and receiving packetized video data 37 over communications network 16. At step 46, transmitting station 12 generates encoded frame 28 of video data. At step 48 encoded frame 28 is packetized into multiple source packets 30-36. At step 50, FEC packets 40 and 42 are generated. At step 52, packetized video data 37, including source packets 28 and FEC error correction packets 38, are transmitted over a communications network 16 and received by receiving station 14. At step 54, receiving station 14 detects whether there are any missing packets in packetized video information 37. This detection can be accomplished by inspecting the sequence numbers in the RTP header of each packet. At step 56, receiving station 14 recovers any missing packets using the received source packets 28 and the FEC error correction packets 40 and 42. At step 58, receiving station 14 decodes the encoded frame 28 of video data represented by packetized information 37.

FEC packets 40 and 42 are generated by transmitting station 12 using a packet mask (referred to generally herein as M). FIG. 5 is a schematic diagram showing a highly simplified, exemplary packet mask 60 used to create the FEC packets 40 and 42 of FIG. 4. Mask 60 is a matrix that specifies the linear combination of source packets to generate an FEC packet. The linear combination is applied over the whole packet data by a bitwise XOR. The packet mask (or the relevant row of the matrix/mask for that packet) is contained in each FEC packet, so the decoder has access to this information (at least for a received FEC packet), and hence can perform the recovery operation.

For example, referring to FIG. 5, packet mask 60 is represented by a four-by-two matrix having rows 62 and 64 and columns 66, 68, 70 and 72. Rows 62 and 64 correspond to FEC packets 40 and 42, respectively. Columns 66, 68, 70 and 72 correspond to source packets 30, 32, 34 and 36, respectively. The values of the matrix are either one or zero, with one indicating which source packets are combined (via an XOR operation) to create the corresponding FEC packet. For example, in row 62 of matrix 60, the values in columns 66 and 70 are each "one," signifying that FEC packet 40 is a combination (XOR) of source packets 30 and 34. Likewise, in row 64 of matrix 60, the values in columns 68 and 70 are each "one," signifying that FEC packet 42 is a combination (XOR) of source packets 32 and 34. If only source packets 30, 32 and 36 are received at receiving station 14, then lost source packet 34 can be recovered by the receiving station if either or both of FEC packets 40 or 42 are received.

Packet mask 60 is thus a matrix with each row corresponding to a particular FEC packet. In accordance with RFC 5109, that particular FEC packet includes in its header the underlying mask so that upon arrival at receiving station 14 the FEC packet can be used to reconstruct missing source packets. The size of packet mask 60 is a function of the channel code's redundancy, (n–k), where n is the total number of packets and k is the number of source packets. Thus, if there are 12 total packets (n) and 10 of those packets (k) are source packets, then there would be two (out of 10) FEC packets, and the packet mask would be a 10×2 matrix. The more FEC packets that are provided in the channel code, the greater the probability of complete recovery of missing packets but the more transmission overhead in the form of additional bytes of error correction code.

An objective of packet mask design is to generate a packet mask (i.e., the matrix of 1s and 0s such as illustrated in FIG. 5) that maximizes or at least improves (empirically) the recovery of lost packets at receiving station 14. In the disclosed embodiments, the design of a packet mask to meet this objective can be accomplished by selecting a mask (from a given set of input masks {M} which has an absolute or local minimum residual packet loss or "RPL" over all possible masks in set {M}. Residual packet loss (RPL) can be expressed as:

$$RPL = p - R(p,b,k,n) \quad [\text{Equation 1}]$$

where p is the packet loss rate experienced on the network and R(p, b, k, n) is the effective recovery rate (ERR) described below.

By way of illustration, at least two approaches can be employed for selecting a mask using RPL. These approaches can be used separately or in combination. First, a set of packet masks can be parameterized and the mask with the smallest RPL function can be selected. Second, masks can be sampled from some initial set, and the sampling process can be driven toward a local minimum of the RPL using for example a gradient descent or Monte-Carlo technique. Thus, references herein to "minimum" or "minimal" herein are not intended to mean absolute minimum but may be local minimums or the lowest values that can be obtained given a finite set of inputs.

Referring to FIG. 6, a method 74 is illustrated for generating packet masks using the RPL function. Method 74 can be implemented by transmitting station 12 in connection with step 50 of FIG. 4. Method 74 can be used to generate packet mask that provide for statistically improved recovery of missing packets. At step 76 of FIG. 6, transmitting station 12 receives source packets (k) such as source packets 26 from the encoded frame 28. At step 78, transmitting station 12 receives RTCP reports on network state, including for example feedback on network quality. These reports contain actual values of network performance parameters described below such asp and b. At step 80, receiving station 12 determines the FEC redundancy (n−k). That is, receiving station determines the ratio, of source packets to FEC packets, thus determining the degree of error correction protection to be afforded by the channel code.

At step 82, transmitting station 12 determines the effective recovery rate ("ERR") as function of FEC redundancy determined at step 80 and other input parameters as discussed below. At step 84, the packet mask to be used is selected by transmitting station 12 using ERR as a term in one or more of the functions described below. At step 86, transmitting station 12 generates the FEC packets and transmits the entire message (source packets and FEC packets) over communications network 16.

The effective recovery rate (ERR) for a given mask M is a function of one or more channel code parameters and network performance parameters. Channel code parameters include: number of input/source packets (k); total number of packets including source packets and FEC packets (n) for the FEC code that is being implemented (in this case, an XOR code). Network performance parameters include packet loss rate (p) and burst length measured as the average number of consecutive packets lost (b). Network performance parameters can be obtained periodically, such as approximately once per second, from RTCP reports. Other types of network performance parameters can be used in place of or in addition to packet loss rate (p) and burst length (b).

In one illustrative embodiment, ERR for given mask M in the set {M} of masks is expressed as:

$$ERR = R(p, b, k, n) = \frac{1}{n} \sum_{t=1}^{n} P(t, p, b, n) A(M; t, k, n) \quad [\text{Equation 2}]$$

where P(t,p,b,n) is the probability of losing t packets (from n total packets), given a packet loss rate p and a burst length b, and A(M;t,k,n) is the average number of packets that can be recovered when t packets (from n total packets) are lost. The two basic quantities in the effective recovery rate—A(M;t,k,n) and P(t,p,b,n)—are expressed as follows.

A(M;t,k,n) represents the average number of packets that can be recovered when t packets are lost for a given (k, n) code:

$$A(M; t, k, n) = \sum_{i=1}^{min(t,n-k)} iC(M; i, t, n) \quad [\text{Equation 3}]$$

where C(M; i,t,n) is the ratio as follows:

$$C(M, i, t, n) = \frac{numRecovConfig(M; i, t, n)}{numConfigs(t, n)} \quad [\text{Equation 4}]$$

where the numerator numRecovConfig is the number of configurations where i packets are recovered after losing t packets, from a total of n packets for the given packet mask M in set {M}. The term configurations as used here means the configurations of recovered packets. The denominator numConfigs is the number of possible configurations which could lose t packets from a total of n packets.

P(t,p,b,n) represents the probability of losing t packets, which is determined using a selected packet loss model. A variety of packet loss models can be selected, including random loss models (such as a Bernoulli process), or a bursty loss model (such as a Markov process). Other packet loss models can be used. When a random loss model is used, there may be a higher level of degeneracy in the selected packet mask configuration.

For improved performance, ERR can be computed in advance, off-line. Referring to FIG. 7, a schematic diagram of a look-up table 90 is provided. Look-up table 90 resides in memory 20 of transmitting station 12 (FIG. 1). Table 90 includes a plurality of rows 92 and columns 94 and 96. Each row 92 is uniquely identified by an index in column 94. A value of ERR resides in column 94 and is determined as function of (p, b) for each value of (k, n−k). Thus ERR=R (p, b, k, n). Input parameters p and b are appropriately discretized to have a manageable table size.

An exemplary approach to generating look-up table 90 is to first compute the quantity P(t,p,b,n) for all values of packet loss models parameters (p,b), and for all values of t. A typical range of t would be 0 to n. A typical value for n would be 48. Next, compute the quantity A(t,k,n) for all values of t, given the values of (k, n−k). The value of k can vary from 1 to n/2. Thus a typical value of k would be 24. The difference of (n−k) can vary from 0 to k. The set packet masks are pre-defined and fixed for this exemplary implementation. For example, likely candidate masks can selected heuristically and then variations can be generated to create a set of masks. Finally, the value of ERR is tabulated for mask M as function of (p,b) for each value of (k,n−k).

As discussed above, at step 84 of FIG. 6, the packet mask can be selected from a set of available masks {M} using the ERR as a term in a residual packet loss calculation. This process has several different features that may be implemented in one or more of the embodiments:

(a) effective recovery rate (ERR) is determined from an underlying statistical model of packet loss events;

(b) computation of residual loss is windowed over a defined range packet loss rates so that the selected mask is tuned to that range of loss rates;

(c) a soft density constraint is used to bias the selected mask towards optimization in a random or bursty loss case; and (d) selected packets are deemed of greater importance that other packets, thus providing unequal protection across packets.

In one embodiment, for a given channel code (k,n−k), and a given a set of input packet masks {M}, a packet mask $M_{selected}$ can be selected as the minimum of the summation RPL over all candidate masks M in set {M} over a range of selected possible loss rates, such as, for example, po=0 to pf=0.5

$$M_{selected} = arginf_M \sum_{p=po}^{p=pf} RPL(M; p, b, k, n) \quad \text{[Equation 5]}$$

where RPL=p−ERR, with ERR defined above. As an alternative implementation, RPL could also be summed over a range of burst length values (b) in addition to summing over loss p. The notation arg inf means to find the argument (in this case M) that results in the minimum value of the function.

The range of summation (po=0 to pf=0.5) can be selected using actual packet loss data derived from RTCP reports.

For improved performance, $M_{selected}$ can be computed in advance, off-line. Referring to FIG. 8, a schematic diagram of a look-up table 98 is provided, Look-up table 98 resides in memory 20 of transmitting station 12 (FIG. 1). Table 98 includes a plurality of rows 100 and columns 102 and 104. Each row 100 is uniquely identified by an index in column 102 and there is one row for every value of $M_{selected}$. A specific selected packet mask (that is, $M_{selected}$) resides in column 102 and is determined as the minimum of RPL in accordance with Equation 5. Thus, four input parameters p, b, k, n are used to construct an index value which is then used to access that one of rows 100 that holds the desired packet mask identified through Equation 5. Note that if a table of RPL values such as table 98 is used, it is not necessary to calculate or look up ERR (such as at step 82 of FIG. 6). This calculation is subsumed in the computation of the table values for RPL.

In the foregoing embodiment, RPL can be calculated for each mask using the whole range of selected possible loss rates, such as, for example, po=0 to pf=0.5. In this case, the packet mask is based on an average packet loss rate. In an alternative embodiment, the selection of a mask can include the identification of a packet mask tuned to a particular range of packet loss rates. This tuning is sometimes referred to herein as "windowing." Thus, the selected packet mask generates a minimized cost function by performing better over a specified window of packet loss rates.

Windowing can provide an improved selection of packet masks because transmitting station 12 receives periodic reports (RTCP) about the network state and thus has information as to the loss ranges that are most likely to occur in the immediate future. If these reports indicate that the loss rate on the network is typically around $\hat{p}$, then the selected packet mask can be tuned to this value. In this alternative embodiment, Equation 5 is modified with a window function $w(p, \hat{p})$ as follows:

$$M_{selected}(\hat{p}) = arginf_M \sum_{p=po}^{p=pf} w(p, \hat{p}) RPL(M; p, k, n) \quad \text{[Equation 6]}$$

where $w(p, \hat{p})$ is the window/weight of the RPL for packet loss value p, given periodic reports indicating that the typical network loss rate is around $\hat{p}$, which can be based on the actual value of loss reported by the network. One example of a window function would be a Gaussian function centered around $\hat{p}$. For example, $(p, \hat{p})=ce^{-(p-\hat{p})^2/\sigma}$, where c is normalization and $\sigma$ is the width/spread of the window around $\hat{p}$.

In yet another alternative embodiment, a soft density constraint term $\mu(\Delta_{row}+\Delta_{column})$ is added to the base function of Equation 5 to bias the selected mask toward solutions that have equal numbers of zeros in each row and column. When a random loss model for packet events is used, it is expected that all source and FEC packets are equally protected. It is therefore optimal in such cases that the selected masks tend to distribute equal numbers of zeros in each row and column. The soft density constraint is a penalty term that increases the cost of masks that have deviation in the number of zeros in each row and column. The cost function can be restated with the soft density constraint as follows:

$$M_{selected} = arginf_M \sum_{p=po}^{p=pf} RPL(M; p, k, n) + \mu(\Delta_{row} + \Delta_{column}) \quad \text{[Equation 7]}$$

where the $\mu$ parameter controls how severely the constraint is imposed in the search algorithm, and $\Delta_{row/column}$ is the variance, or deviation, of the number of zeros (for each row and column) in the packet mask. The value of t can vary depending on the model employed, with a larger $\mu$ for random distribution model and a smaller g for a correlated/bursty model. When a random loss model is employed with equal protection across all packets, the packet mask is characterized by the number of 0 s in each row/column, and the degree of overlap between rows. For small packet loss, the matrix is less dense in the number of 0 s, and has more row-overlap. For large packet loss values, the mask is more sparse with larger density of 0 s.

The terms of Equation 6 and Equation 7 are not mutually exclusive. That is, the window function $w(p, \hat{p})$ can be incorporated as a factor to be multiplied by RPL(M; p, k, n) as that term is used in Equation 7. Likewise, the soft density constraint can be incorporated in Equation 6 as an addend such as shown in Equation 7.

In an alternative embodiment, the cost function can be modified to provide unequal protection of packets. Unequal protection refers to favoring the protection of some packets in the frame over other packets when the favored packets contain more important data or are more likely to be lost. For example, favored packets may arise when transmitting video data encoded using a codec that has data partitioning. Some partitions (and hence, the packets that contain those partitions) are more important that others since they contain motion vectors, filter coefficients or otherwise have information used to reconstruct subsequent partitions.

It may also be appropriate to favor packets when a packets are known in advance to be more important (e.g., layered coding, or when FEC packets are applied across layers). Protection may also be appropriate when there is an indication of which packets in the stream are more likely to be lost. For example, packets in the beginning, middle or end of the stream are more susceptible to arriving late. It is also possible to favor bits within a single packet.

One illustrative method for providing unequal packet protection (that is, for favoring certain packets over others) is to modify the ERR function to include a term that weights more heavily the protection of certain packets. Thus, masks that result in higher recovery of these certain packets will have disproportionally higher ERR and thus be more likely to be the selected mask (i.e., the mask with the lowest residual packet loss). The modified ERR function is stated as follows:

$$ERR = R(p, b, k, n) \qquad \text{[Equation 8]}$$

$$= \frac{1}{n}\sum_{t=1}^{n} P(t, p, b, n)\tilde{A}(M; t, k, n)$$

where $\tilde{A}(M; t, k, n)$ represents a modified average number of packets that can be recovered using mask M when t packets are lost from a total of n packets having k source packets). $A(M; t, k, n)$ is expressed as follows:

$$\tilde{A}(M; t, k, n) = \sum_{i=1}^{min(t,n-k)} i\tilde{C}(M; i, t, n) \qquad \text{[Equation 9]}$$

The average is modified by the term $\tilde{C}(M; i, t, n)$, which favors or weights certain packets. $\tilde{C}(M; i, t, n)$ is a ratio that is expressed as follows:

$$\tilde{C}(M; i, t, n) = \frac{\sum_{x=1}^{numRecovConfig(M;i,t,n)} I_i(\vec{s}(x))}{numConfig(t, n)} \qquad \text{[Equation 10]}$$

where the numerator is the sum of packet importance factors $I_i(\vec{s}(x))$ for each configuration x of recovering i packets when t packets are lost from a total of n packets, and the denominator is as described in Equation 4. The packet importance factor $I_i(\vec{s}(x))$ is a function of $\vec{s}(x)$, which denotes the index of recovered packets for the $x^{th}$ configuration of recovered packets (e.g., a configuration of recovered packets 1, 3 and 5 versus a configuration of recovered packets 2, 4, and 7). For example, $\vec{s}(x)=\{s_1=1, s_2=3, s_3=5\}_x$ for the configuration where the recovered packets are (1, 3, 5), for i=3. The index x ranges over all possible the configurations of the numerator.

The packet importance factor $I_i(\vec{s}(x))$ is the average of weightings for each of the i elements of $\vec{s}(x)$. $I_i(\vec{s}(x))$ is expressed as follows:

$$I_i(\vec{s}(x)) = \frac{1}{i}\sum_{j=1}^{i} m(s_j(x)) \qquad \text{[Equation 11]}$$

where the weight $m(s_j(x))$ on each packet is chosen to represent the importance of the subject packet. For example, $m(s_j(x))>1$ can be selected for packets that are deemed more important. Correspondingly, $m(s_j(x))<1$ can be selected for packets that are deemed less important. For example, for a configuration $\vec{s}(x)=\{s_1=1, s_2=3, s_3=5\}_x$, the weighting could be $\{m(s_1(x))=1.5, m(s_2(x))=0.9, m(s_3(x))=0.9\}$. The packet importance function $I_i(\vec{s}(x))$ would be the average of this weighting. A larger weight $m(s_j(x))$ on a particular packet results in a higher value of $\tilde{C}(M; i, t, n)$ (and thus ERR) for packet masks that better protect that packet. This will drive the minimization process of the residual packet loss function, RPL=p–ERR, toward a packet mask with more protection (and hence better effective recovery) for the desired packet.

Thus, unequal or favored packet protection is provided. For example, in some applications, the first few packets may contain information for which more protection is desired. In such case, the weighting for those packets (e.g., $s_1$, $s_2$) can be higher. If equal protection were provided, then the packet importance weights could, for example, all be equal to one—that is, $m(s_j(x))=1$ for all j, x, and Equation 11 is equal to Equation 4.

Transmitting station 12 and receiving station 14 can be implemented in a wide variety of configurations. For example, transmitting station 12 or receiving station 14 can be implemented using a general purpose processor 18 or 22 (respectively) and a computer program that, when executed, carries out any of the respective methods, algorithms and/or instructions described herein. In addition or alternatively, for example, a special purpose processor can be utilized which can contain specialized hardware for carrying out any of the methods, algorithms and/or instructions described herein. Portions of transmitting station 12 or receiving station 14 do not necessarily have to be implemented in the same manner. Thus, for example, computation of RPL can be implemented in hardware whereas other computations described above can be implemented in software.

All or a portion of embodiments of the present invention can take the form of a computer program product accessible from, for example, a computer-usable or computer-readable medium. A computer-usable or computer-readable medium can be any device that can, for example tangibly contain, store, communicate, and/or transport the program for use by or in connection with any processor. The medium can be, for example, an electronic, magnetic, optical, electromagnetic, or a semiconductor device. Other suitable mediums are also available.

The above-described embodiments have been described in order to allow easy understanding of the present invention and do not limit the present invention. On the contrary, the invention is intended to cover various modifications and equivalent arrangements included within the scope of the appended claims, which scope is to be accorded the broadest interpretation so as to encompass all such modifications and equivalent structure as is permitted under the law.

What is claimed is:

1. A method for generating an error correcting code for use with a plurality of source packets to be transmitted over a network, comprising:

identifying a plurality of candidate packet masks, wherein each candidate packet mask of the plurality of candidate packet masks is a matrix that specifies at least one linear combination of source packets to generate respective error correcting codes;

determining one or more channel code parameters;

determining, for at least some of the plurality of candidate packet masks, a residual packet loss value that is calculated over a range of at least one network performance parameter using the one or more channel code parameters;

selecting at least one of the plurality of candidate packet masks based on at least one of the determined residual packet loss values; and generating the error correcting code using the selected candidate packet mask and at least one of the plurality of source packets.

2. The method of claim 1, wherein the at least one network performance parameter is one of packet loss rate (p) or burst length (b).

3. The method of claim 1, wherein the at least one network performance parameter includes the parameters of packet loss rate (p) and the one or more channel code parameters include the number of packets (n) and the number of source packets (k), wherein determining the residual packet loss value further comprises:

determining an expected recovery rate based on a statistical model of the probability of losing packets, wherein the expected recovery rate is a function of a probability of losing t packets and an average number of packets that can be recovered when t packets are lost; and subtracting the expected recovery rate from a packet loss rate.

4. The method of claim 3, wherein determining the expected recovery rate for a given packet mask M is calculated as:

$$ERR = \frac{1}{n}\sum_{t=1}^{n} P(t, p, b, n)\tilde{A}(M; t, k, n)$$

wherein P(t, p, b, n) is the probability of losing t packets (from n total packets), given a packet loss rate (p) and a burst length (b); and A(M; t, k, n) is the average number of packets that can be recovered when t packets (from n total packets) are lost.

5. The method of claim 3, wherein determining the expected recovery rate further comprises:

determining the expected recovery rate for at least one range of the one or more channel code parameters; and sorting the expected recovery rates in memory indexed by the range of the one or more channel code parameters.

6. The method of claim 1, wherein the at least one network performance parameter includes packet loss rate (p), and wherein selecting at least one of the plurality of candidate packet masks further comprises:

determining for each of the plurality of candidate masks the sum of residual packet loss values over a range of packet loss rates (p); and selecting one of the plurality of candidate masks based on the sum of residual packet loss values determined for that mask.

7. The method of claim 6, wherein selecting one of the plurality of candidate masks based on the sum of residual packet loss values further comprises:

selecting that one of the plurality of candidate masks that has the minimum sum of residual packet loss values.

8. The method of claim 6, wherein selecting one of the candidate masks based on the sum of residual packet loss values further comprises:

selecting that one of the plurality of candidate masks that has a local minimum of residual packet loss values using at least one of a gradient descent technique or Monte Carlo technique.

9. The method of claim 1, wherein the at least one network performance parameter includes a predicted packet loss rate ($\hat{p}$), and wherein selecting at least one of the plurality of candidate packet masks further comprises:

determining for each of the plurality of candidate masks the sum, over a range of possible packet loss rates, of residual packet loss values multiplied by a weighting factor that is a function of the predicted packet loss rate ($\hat{p}$).

10. The method of claim 1, wherein the at least one network performance parameter includes a packet loss rate (p), and wherein selecting at least one of the plurality of candidate packet masks further comprises:

determining for each of the plurality of candidate masks the sum, over a range of possible packet loss rates (p), of residual packet loss values incremented by a soft density constraint term.

11. The method of claim 10, further comprising:

determining a predicted packet loss rate ($\hat{p}$);

wherein the residual packet loss values are multiplied by a weighting factor that is a function of the predicted packet loss rate ($\hat{p}$).

12. The method of claim 10, wherein the soft density constraint term is based on the variance of the number of zeros for each row and column in the packet mask M for which the sum is calculated.

13. The method of claim 1, wherein determining the residual packet loss value further comprises:

identifying at least some of the plurality of source packets as having an importance value; and determining, for at least one of the plurality of candidate packet masks, an expected recovery rate that is a function of the importance value of packets that would be recovered using that packet mask;

wherein determining a residual packet loss value for the at least one mask further comprises using the determined expected recovery rate of that mask.

14. The method of claim 13, wherein the plurality of source packets comprise a frame of video information which includes at least two partitions, and wherein those source packets containing information from one of the at least two partitions are identified as having a higher importance value than other source packets.

15. The method of claim 13, wherein the at least one network performance parameter includes packet loss rate (p) and burst length (b), the least one channel code parameter includes the number of packets (n) and the number of source packets (k), and the expected recovery rate (ERR) for a packet mask M further comprises solving the following equation:

$$ERR = \frac{1}{n}\sum_{t=1}^{n} P(t, p, b, n)\hat{A}(M; t, k, n)$$

where P(t, p, b, n) is the probability of losing t packets (from n total packets) for a packet loss rate p and a burst length b, and Â(M; t, k, n) is a modified average of number of packets that can be recovered using the mask M when t packets (from n total packets having k source packets) are lost.

16. The method of claim 15, wherein the term Â(M; t, k, n) is determined for a given mask M using the ratio of: (a) the sum of packet importance factors for each configuration of recovering i packets when t packets are lost from a total of n packets, over (b) the number of configurations which have t lost packets from a total of n packets.

17. The method of claim 16, wherein the packet importance factor for a given configuration is a summation over the recovered packets for that configuration, with a weight factor for at least one packet of the configuration that is indicative of the importance of that packet.

18. A method for transmitting packetized data over a communications network, comprising:
    identifying a plurality of candidate packet masks, wherein each candidate packet mask of the plurality of candidate packet masks is a matrix that specifies at least one linear combination of source packets to generate respective error correcting codes;
    identifying an importance value of the packetized data;
    determining one or more channel code parameters;
    determining, for at least some of the plurality of candidate packet masks, a residual packet loss value that is calculated over a range of at least one network performance parameter using the one or more channel code parameters; wherein the residual packet loss value is a function at least in part of the importance value identified for the packetized data that would be recovered using that packet mask;
    selecting at least one of the plurality of candidate packet masks based on at least one of the determined residual packet loss values;
    generating the error correcting code using the selected candidate packet mask and the packetized data; and
    transmitting the packetized data and error correcting code over the communications network.

19. The method of claim 18, wherein the at least one network performance parameter includes the parameters of packet loss rate (p) and the one or more channel code parameters include the number of packets (n) and the number of source packets (k), wherein determining the residual packet loss value further comprises:
    determining an expected recovery rate based on a statistical model of the probability of losing packets; and
    subtracting the expected recovery rate from a packet loss rate.

20. The method of claim 19, wherein determining the expected recovery rate for a given packet mask M is calculated as:

$$ERR = \frac{1}{n}\sum_{t=1}^{n} P(t, p, b, n)A(M; t, k, n)$$

wherein P(t, p, b, n) is the probability of losing f packets (from n total packets), given a packet loss rate (p) and a burst length (b), and A(M; t, k, n) is the average number of packets that can be recovered when t packets (from n total packets) are lost.

21. The method of claim 19, wherein determining the expected recovery rate further comprises:
    determining the expected recovery rate for at least one range of the one or more channel code parameters; and
    sorting the expected recovery rates in memory indexed by the range of the one or more channel code parameters.

22. The method of claim 19 wherein the at least one network performance parameter includes packet loss rate (p), and wherein selecting at least one of the plurality of candidate packet masks further comprises:
    determining for each of the plurality of candidate masks the sum of residual packet loss values over a range of packet loss rates (p); and
    selecting one of the plurality of candidate masks based on the sum of residual packet loss values determined for that mask.

23. An apparatus for generating an error correcting code for use with a plurality of source packets to be transmitted over a network, comprising:
    memory; and
    a processor configured to execute instructions stored in the memory to:
        determine at least one channel code parameter associated with the error correcting code;
        determine, for each of a plurality of candidate packet masks, a residual packet loss value that is calculated using the at least one channel code parameter and at least one network performance parameter, wherein each candidate packet mask of the plurality of candidate packet masks is a matrix that specifies at least one linear combination of source packets to generate respective error correcting codes; and
        select at least one of the plurality of candidate packet masks based on at least one of the determined residual packet loss values; and generate the error correcting code using the selected candidate packet mask and at the at least one source packet.

* * * * *

UNITED STATES PATENT AND TRADEMARK OFFICE
CERTIFICATE OF CORRECTION

PATENT NO. : 8,661,323 B2  
APPLICATION NO. : 13/103565  
DATED : February 25, 2014  
INVENTOR(S) : Marco Paniconi Page 1 of 1

It is certified that error appears in the above-identified patent and that said Letters Patent is hereby corrected as shown below:

Title Page 2, Column 2, Line 25, "Transaactions" should be "Transactions"

In the Claims

Column 11, Claim 4, Line 32, "Â" should be "A"

Column 12, Claim 15, Line 53, "A" should be "Â"

Signed and Sealed this  
Sixth Day of May, 2014

Michelle K. Lee  
*Deputy Director of the United States Patent and Trademark Office*